(12) United States Patent
Enomoto et al.

(10) Patent No.: US 11,222,682 B1
(45) Date of Patent: Jan. 11, 2022

(54) APPARATUSES AND METHODS FOR PROVIDING REFRESH ADDRESSES

(71) Applicant: MICRON TECHNOLOGY, INC., Boise, ID (US)

(72) Inventors: Honoka Enomoto, Tokyo (JP); Masaru Morohashi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/007,069

(22) Filed: Aug. 31, 2020

(51) Int. Cl.
*G11C 11/406* (2006.01)

(52) U.S. Cl.
CPC ................... *G11C 11/406* (2013.01)

(58) Field of Classification Search
CPC ..................................... G11C 11/406
USPC ....................................... 365/149
See application file for complete search history.

(56) References Cited

U.S. PATENT DOCUMENTS

| | | |
|---|---|---|
| 1,158,364 A | 10/1915 | Bibb |
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |

(Continued)

FOREIGN PATENT DOCUMENTS

| | | |
|---|---|---|
| CN | 1195173 A | 10/1998 |
| CN | 101038785 A | 9/2007 |

(Continued)

OTHER PUBLICATIONS

U.S. Appl. No. 17/446,710 titled "Apparatuses, Systems, and Methods for Determining Extremum NumericalValues" filed Sep. 1, 2021, pp. all.

(Continued)

*Primary Examiner* — Xiaochun L Chen
(74) *Attorney, Agent, or Firm* — Dorsey & Whitney LLP

(57) ABSTRACT

Apparatuses and methods for generating refresh addresses for row hammer refresh operations are disclosed. In some examples, determination of a row address associated with a highest count value may be initiated at a precharge command preceding a row hammer refresh operation. The row address determined to be associated with the highest count value may be provided for generating the refresh addresses.

19 Claims, 7 Drawing Sheets

(56) References Cited

U.S. PATENT DOCUMENTS

| | | |
|---|---|---|
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Done et al. |
| 7,565,479 B2 | 7/2009 | Best et al. |
| 7,830,742 B2 | 11/2010 | Han |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tawa |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 * | 10/2019 | Oh ........ G11C 11/406 |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,043,254 B2 | 6/2021 | Enomoto et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Done et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |

(56) References Cited

U.S. PATENT DOCUMENTS

| | | |
|---|---|---|
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0355332 A1 | 12/2014 | Youn et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1* | 1/2017 | Oh .............. G11C 11/40622 |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |

(56) References Cited

U.S. PATENT DOCUMENTS

| | | | |
|---|---|---|---|
| 2019/0147941 A1 | 5/2019 | Qin et al. |
| 2019/0147964 A1 | 5/2019 | Yun et al. |
| 2019/0161341 A1 | 5/2019 | Howe |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |

FOREIGN PATENT DOCUMENTS

| | | | |
|---|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 1020180064940 A | 6/2018 |
| KR | 1020180085184 A | 7/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |

OTHER PUBLICATIONS

U.S. Appl. No. 17/470,883 titled "Apparatuses and Methods for Tracking Victim Rows" filed Sep. 9, 2021, pp. all.
Application No. PCT/US20/23689, titled "Semiconductor Device Having Cam That Stores Address Signals", dated Mar. 19, 2020, pp. all.
U.S. Appl. No. 15/884,192 entitled 'Semiconductor Device Performing Row Hammer Refresh Operation', filed Jan. 30, 2018, pp. all.
U.S. Appl. No. 16/797,658, titles "Apparatuses and Methods for Controlling Refresh Operations", filed Feb. 21, 2020, pp. all.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/805,197, titled "Apparatuses and Methods for Calculating Row Hammer Refresh Addresses in a Semiconductor Device", dated Feb. 28, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
U.S. Appl. No. 16/268,818, titled "Apparatuses and Methods for Managing Row Access Counts", filed Feb. 6, 2019, pp. all.
U.S. Appl. No. 16/286,187 titled "Apparatuses and Methods for Memory Mat Refresh Sequencing" filed on Feb. 26, 2019; pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/886,284, titled "Apparatuses and Methods for Access Based Refresh Timing", dated May 28, 2020, pp. all.
U.S. Appl. No. 16/358,587, titled "Semiconductor Device Having Cam That Stores Address Signals", dated Mar. 19, 2019, pp. all.
U.S. Appl. No. 16/375,716 titled "Apparatuses and Methods for Staggered Timing of Targeted Refresh Operations" filed on Apr. 4, 2019; pp. all.
U.S. Appl. No. 16/936,297 titled "Apparatuses and Methods for Managing Row Access Counts" filed Jul. 22, 2020, pp. all.
U.S. Appl. No. 16/411,573 titled "Apparatuses, Systems, and Methods for a Content Addressable Memory Cell" filed May 14, 2019, pp. all.
U.S. Appl. No. 16/428,625 titled "Apparatuses and Methods for Tracking Victim Rows" filed May 31, 2019, pp. all.
U.S. Appl. No. 16/513,400 titled "Apparatuses and Methods for Tracking Row Accesses" filed Jul. 16, 2019, pp. all.

(56) References Cited

OTHER PUBLICATIONS

U.S. Appl. No. 17/060,403 titled "Apparatuses and Methods for Adjusting Victim Data" filed Oct. 1, 2020, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, pp. all.
U.S. Appl. No. 16/546,152 titled "Apparatuses and Methods for Analog Row Access Tracking" filed Aug. 20, 2019, pp. all.
U.S. Appl. No. 16/549,411 titled "Apparatuses and Methods for Dynamic Refresh Allocation" filed Aug. 23, 2019, pp. all.
U.S. Appl. No. 16/655,110 titled "Apparatuses and Methods for Dynamic Targeted Refresh Steals" filed Oct. 16, 2019, pp. all.
U.S. Appl. No. 17/154,945 titled "Apparatuses, Systems, and Methods for a Content Addressable Memory Cell" filed Jan. 21, 2021, pp. all.
U.S. Appl. No. 17/170,616 titled "Apparatuses, Systems, and Methods for Analog Row Access Rate Determination" filed Feb. 8, 2021, pp. all.
U.S. Appl. No. 17/168,036 titled "Apparatuses and Methods for Analog Row Access Tracking" filed Feb. 4, 2021, pp. all.
U.S. Appl. No. 17/301,533 titled "Semiconductor Device Having Cam That Stores Address Signals" filed Apr. 6, 2021, pp. all.
International Application No. PCT/US19/40169 titled "Apparatus and Methods for Triggering Row Hammer Address Sampling" filed Jul. 1, 2019, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
International Application No. PCT/US20/40077, titled "Apparatuses and Methods for Monitoring Word Line Accesses", dated Jun. 29, 2020, pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack With a Bandpass Filter' filed on Jan. 26, 2018, pp. all.
U.S. Appl. No. 16/425,525 titled "Apparatuses and Methods for Tracking All Row Accesses" filed May 29, 2019, pp. all.
U.S. Appl. No. 16/427,105 titled "Apparatuses and Methods for Priority Targeted Refresh Operations" filed May 30, 2019, pp. all.
U.S. Appl. No. 16/427,140 titled "Apparatuses and Methods for Tracking Row Access Counts Between Multiple Register Stacks" filed May 30, 2019, pp. all.
U.S. Appl. No. 16/437,811 titled "Apparatuses, Systems, and Methods for Determining Extremum Numerical Values" filed Jun. 11, 2019, pp. all.
U.S. Appl. No. 16/537,981 titled "Apparatuses and Methods for Controlling Targeted Refresh Rates" filed Aug. 12, 2019, pp. all.
U.S. Appl. No. 17/153,555 titled "Apparatuses and Methods for Dynamically Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021, pp. all.
U.S. Appl. No. 17/375,817 titled "Apparatuses and Methods for Monitoring Word Line Accesses" filed Jul. 14, 2021, pp. all.
U.S. Appl. No. 17/443,056 titled "Apparatuses and Methods for Multiple Row Hammer Refresh Address Sequences" filed Jul. 20, 2021, pp. all.
U.S. Appl. No. 17/444,925 titled "Apparatuses and Methods for Countering Memory Attacks" filed Aug. 12, 2021, pp. all.

U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed on Oct. 27, 2017; pp. all.
U.S. Appl. No. 16/012,679, titled "Apparatuses and Methods for Multiple Row Hammer Refresh Address Sequences", filed Jun. 19, 2018; pp. all.
U.S. Appl. No. 16/020,863, titled "Semiconductor Device", filed Jun. 27, 2018; pp. all.
U.S. Appl. No. 16/112,471 titled "Apparatuses and Methods for Controlling Refresh Operations" filed Aug. 24, 2018; pp. all.
U.S. Appl. No. 16/160,801, titled "Apparatuses and Methods for Selective Row Refreshes" filed on Oct. 15, 2018, pp. all.
U.S. Appl. No. 16/176,932, titled "Apparatuses and Methods for Access Based Refresh Timing", filed Oct. 31, 2018; pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018; pp. all.
U.S. Appl. No. 16/231,327 titled "Apparatuses and Methods for Selective Row Refreshes", filed on Dec. 21, 2018; pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019; pp. all.
U.S. Appl. No. 16/374,623, titled "Semiconductor Device Performing Row Hammer Refresh Operation", filed Apr. 3, 2019; pp. all.
U.S. Appl. No. 16/411,698 title "Semiconductor Device" filed May 14, 2019; pp. all.
U.S. Appl. No. 16/427,330 titled "Apparatuses and Methods for Storing Victim Row Data" filed May 30, 2019; pp. all.
U.S. Appl. No. 16/431,641 titled "Apparatuses and Methods for Controlling Steal Rates" filed Jun. 4, 2019; pp. all.
U.S. Appl. No. 16/682,606, titled "Apparatuses and Methods for Distributing Row Hammer Refresh Events Across a Memory Device", filed Nov. 13 2019; pp. all.
U.S. Appl. No. 17/102,266, titled "Apparatuses and Methods for Tracking Word Line Accesses", dated Nov. 23, 2020; pp. all.
U.S. Appl. No. 15/876,566 entitled 'Apparatuses and Methods for Calculating Row Hammer Refresh Addresses in a Semiconductor Device' filed on Jan. 22, 2018; pp. all.
International Application No. PCT/US20/32684, titled "Apparatuses, Systems, and Methods for a Content Addressable Memory Cell", dated May 13, 2020; pp. all.
U.S. Appl. No. 15/656,084, titled "Apparatuses and Methods for Targeted Refreshing of Memory", filed Jul. 21, 2017; pp. all.
U.S. Appl. No. 16/459,520 titled "Apparatuses and Methods for Monitoring Word Line Accesses", filed Jul. 1, 2019, pp. all.
PCT Application No. PCT/US18/55821 "Apparatus and Methods for Refreshing Memory" filed Oct. 15, 2018., pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 14, 2018, pp. all.
U.S. Appl. No. 16/459,507 titled "Apparatuses and Methods for Adjusting Victim Data", filed Jul. 1, 2019, pp. all.
U.S. Appl. No. 15/281,818, entitled: "Semiconductor Device" filed Sep. 30, 2016; pp. all.
Kim, et al., "Flipping Bits in Memory Without Accessing Them: An Experimental Study of DRAM Disturbance Errors", IEEE, Jun. 2014, 12 pgs.
Stout, Thomas et al., "Voltage Source Based Voltage-to-Time Converter", IEEE, downloaded Jul. 2020, p. All.

* cited by examiner ically, the determination is triggered by the initiation of the RHR operation (e.g., activation of RHR signal). However, the determination of the counter with the highest count value may take some period of time. If the determination is initiated too late and/or takes too long to complete, an address may not be provided from the address storing circuit

APPARATUSES AND METHODS FOR PROVIDING REFRESH ADDRESSES

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory device as a physical signal (e.g., a charge on a capacitive element). The memory device may include a volatile memory, and the physical signal may decay over time (which may degrade or destroy the information stored in the memory cells). It may be necessary to periodically refresh the information in the memory cells by, for example, rewriting the information to restore the physical signal to an initial value. This periodic refreshing of the memory cells may be referred to as auto-refresh operations.

As memory components have decreased in size, the density of memory cells has greatly increased. Repeated access to a particular memory cell or group of memory cells (often referred to as a 'row hammer') may cause an increased rate of data degradation in nearby memory cells, for example, those located at word lines adjacent to the accessed word line. Memory cells affected by the row hammer effect may be identified and refreshed as part of a targeted refresh operation performed by the memory device, also referred to as a row hammer refresh (RHR) operation. These targeted refresh operations may take the place of (e.g., steal) time slots which would otherwise be used for an auto-refresh operation.

To perform RHR operations, addresses of word lines may be stored in an address storing circuit and one of the addresses is provided from the address storing circuit at a time of the row hammer refresh operation to generate one or more refresh addresses. However, if the address is not provided from the address storing circuit in time, the RHR operation may not be performed properly and/or the RHR operation may be delayed (e.g., delayed until the next steal time slot).

DETAILED DESCRIPTION

Figure 1:
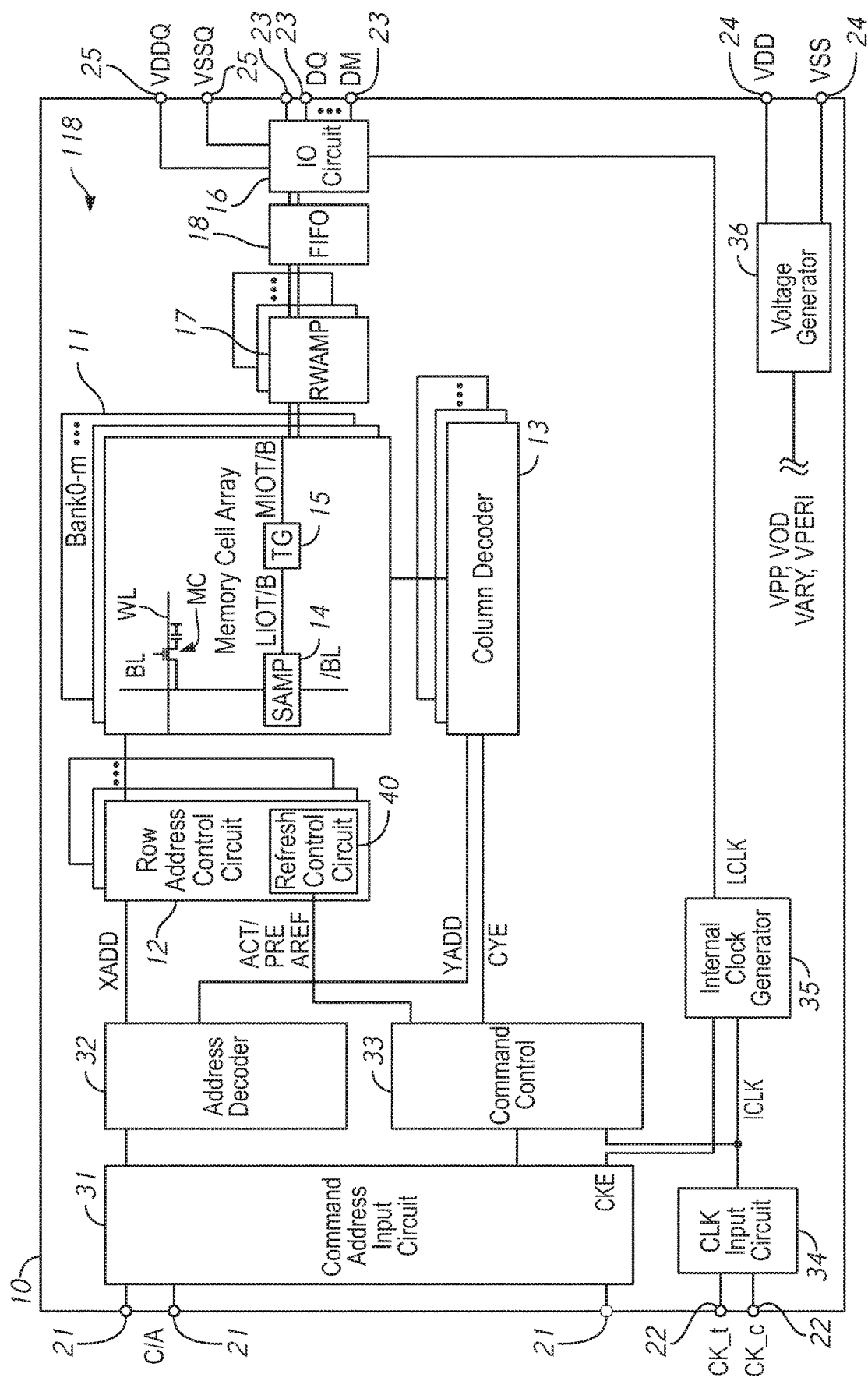
FIG. 1 is a block diagram of a semiconductor device according to an embodiment of the present disclosure.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Information in a volatile memory device may be stored in memory cells (e.g., as a charge on a capacitive element), but may decay over time. In order to prevent information from being lost or corrupted due to this decay, the memory may carry out a refresh process, such as refresh operations as part of a refresh mode. The memory cells may be organized into rows (word lines) and columns (bit lines), and the memory cells may be refreshed on a row-by-row basis. During a refresh operation, information may be rewritten to the word line to restore its initial state. Auto-refresh operations may be performed on the word lines of the memory in a sequence such that over time each of the word lines of the memory are refreshed at a rate faster than the expected rate of data degradation.

Repeated access to a particular word line of memory (e.g., an aggressor row) may cause an increased rate of decay in word lines (e.g., victim rows) which are close to the aggressor row. These repeated accesses may be part of a deliberate attack against the memory and/or may be due to 'natural' access patterns of the memory. The increased rate of decay in the victim rows may require that they be refreshed as part of a targeted refresh operation, also referred to as a row hammer refresh (RHR) operation. The memory device may periodically perform targeted refresh operations as part of the refresh mode. For example, when the memory device is in a refresh mode it may perform a set of refresh operations including a number of auto-refresh operations, and a number of RHR operations and then repeat this cycle. In some embodiments, the RHR operations may 'steal' timeslots which would otherwise be used for auto-refresh operations. A memory device may generally cycle between performing access operations for a period of time, entering a refresh mode for a period of time, performing access operations and so forth.

In some applications, some or all of the addresses of word lines accessed may be monitored. For example, the addresses of accessed word lines may be stored in an address storing circuit. The number of times the word lines are accessed may also be monitored. For example, each address stored in the address storing circuit may be associated with a counter that keeps track of the number of times the word line associated with the address is accessed. When an RHR operation is performed, one or more addresses of word lines at which accesses are concentrated (e.g., the word lines accessed the most, an aggressor row) may be provided from the address storing circuit to generate one or more refresh addresses (e.g., the addresses associated with victim word lines to be refreshed during the RHR operation).

In order to provide the address of a word line at which accesses are concentrated, the address associated with a counter having the highest count value is determined. Typically, the determination is triggered by the initiation of the RHR operation (e.g., activation of RHR signal). However, the determination of the counter with the highest count value may take some period of time. If the determination is initiated too late and/or takes too long to complete, an address may not be provided from the address storing circuit in time for refresh addresses to be generated for refreshing the associated word lines by the RHR operation. If the address is not provided from the address storing circuit in time, the RHR operation may not be performed properly and/or the RHR operation on the word lines may be delayed (e.g., delayed until the next steal time slot).

According to embodiments of the present disclosure, determination of a counter circuit of an address storing circuit with a highest count value may be initiated by a signal (or a transition of the signal) preceding a RHR operation. For example, a command may be used to initiate the determination prior to the RHR operation. This may permit additional time prior to the RHR operation for the determination of the counter with the highest count value, providing an address associated with the counter, and generating one or more refresh addresses from the address. The additional time may reduce or eliminate the risk that refresh addresses will not be available for the RHR operation. In some embodiments of the disclosure, a precharge command preceding a RHR operation may initiate determination of a counter circuit of an address storing circuit with a highest count value.

As used herein, an activation of a signal may refer to any portion of a signal's waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

FIG. 1 is a block diagram of a semiconductor device 10 according to an embodiment of the present disclosure. The semiconductor device 10 may be a DDR4 SDRAM incorporated in a single semiconductor chip, for example. However, semiconductor device 10 may be any other suitable memory type in other embodiments, such as DDR5, LPDDR4, and/or LPDDR5. The semiconductor device 10 may be mounted on an external substrate, for example, a memory module substrate or a mother board. As shown in FIG. 1, the semiconductor device 10 includes a memory cell array 11. The memory cell array 11 includes multiple of word lines WL, multiple of bit lines BL, and multiple of memory cells MC arranged at intersections of the word lines WL and the bit lines BL. Selection of a word line WL is performed by a row address control circuit 12, and selection of a bit line BL is performed by a column decoder 13. A sense amplifier 14 is connected to a corresponding bit line BL and a pair of local I/O lines LIOT/B. The pair of local I/O lines LIOT/B is connected to a pair of main I/O lines MIOT/B via a transfer gate 15 functioning as a switch. The memory cell array 11 is divided into (m+1) memory banks including memory banks BANK0 to BANKm.

Multiple external terminals included in the semiconductor device 10 include command address terminals 21, clock terminals 22, data terminals 23, and power-supply terminals 24 and 25. The data terminals 23 are connected to an I/O circuit 16.

A command address signal CA is supplied to the command address terminals 21. One of the command address signals CA supplied to the command address terminals 21, which relates to an address, is transferred to an address decoder 32 via a command address input circuit 31. Another one that relates to a command is transferred to a command control circuit 33 via the command address input circuit 31. The address decoder 32 decodes an address signal and generates a row address XADD and a column address YADD. The row address XADD is supplied to the row address control circuit 12, and the column address YADD is supplied to the column decoder 13. Further, a command address signal CA that functions as a clock enable signal CKE is supplied to an internal clock generator 35.

Complementary external clock signals CK_t and CK_c are supplied to the clock terminals 22. The complementary external clock signals CK_t and CK_c are input to a clock input circuit 34. The clock input circuit 34 generates an internal clock signal ICLK based on the complementary external clock signals CK_t and CK_c. The internal clock signal ICLK is supplied to at least the command control circuit 33 and the internal clock generator 35. The internal clock generator 35 is activated by the clock enable signal CKE, for example, and generates an internal clock signal LCLK based on the internal clock signal ICLK. The internal clock signal LCLK is supplied to the I/O circuit 16. The internal clock signal LCLK is used as a timing signal that defines a timing at which read data DQ is output from the data terminal 23 at the time of a read operation. In a write operation, write data is input to the data terminal 23 from outside. In the write operation, a data mask signal DM may be input to the data terminal 23 from outside.

Power-supply potentials VDD and VSS are supplied to the power-supply terminals 24. These power-supply potentials VDD and VSS are supplied to a voltage generator 36. The voltage generator 36 generates various internal potentials VPP, VOD, VARY, and VPERI, for example, based on the power-supply potentials VDD and VSS. The internal potential VPP is used mainly in the row address control circuit 12. The internal potentials VOD and VARY are used mainly in the sense amplifier 14 included in the memory cell array 11. The internal potential VPERI is used in many other circuit blocks.

Power-supply potentials VDDQ and VSSQ are supplied to the I/O circuit 16 from the power-supply terminals 25. Although the power-supply potentials VDDQ and VSSQ may be the same potentials as the power-supply potentials VDD and VSS supplied to the power supply terminals 24, respectively, the dedicated power-supply potentials VDDQ and VSSQ are assigned to the I/O circuit 16 in order to prevent propagation of power-supply noise generated in the I/O circuit 16 to another circuit block.

The command control circuit 33 may provide one or more internal signals, responsive, at least in part, to external commands received via the command address input circuit 31. For example, the command control circuit 33 may provide an activation/precharge signal ACT/PRE, a refresh signal AREF, and/or a column selection signal CYE. When a read command is issued from outside, following the activation command, the command control circuit 33 activates a column selection signal CYE. The column selection signal CYE is supplied to the column decoder 13. In response to this signal, read data is read out from the memory cell array 11. The read data read from the memory cell array 11 is transferred to the I/O circuit 16 via a read-write amplifier 17 and an FIFO circuit 18, and is output to outside via the data terminals 23.

The command control circuit 33 activates an activation signal ACT when an activation command is issued, and activates a refresh signal AREF when a refresh command is issued. The activation signal ACT and the refresh signal AREF are both supplied to the row address control circuit 12. The row address control circuit 12 includes a refresh control circuit 40. The refresh control circuit 40 controls a refresh operation for the memory cell array 11 based on the row address XADD, the activation signal ACT, and the refresh signal AREF.

In some embodiments, the refresh signal AREF may be a pulse signal which is activated when the command control circuit 33 receives a signal which indicates entry to the self-refresh mode. The refresh signal AREF may be activated once immediately after command input, and thereafter may be cyclically activated at desired internal timing. The refresh signal AREF may be used to control the timing of refresh operations during the refresh mode. A self-refresh exit command may cause the automatic activation of the refresh signal AREF to stop and may cause the device 10 to return to an idle state and/or resume other operations.

The refresh signal AREF is supplied to the refresh control circuit 40. The refresh control circuit 40 supplies a refresh row address and the row address control circuit 12 may refresh one or more word lines WL indicated by the refresh row address. In some embodiments, the refresh address may represent a single word line. In some embodiments, the refresh address may represent multiple word lines, which may be refreshed sequentially or simultaneously by the row address control circuit 12. In some embodiments, the number of word lines represented by the refresh address may vary from one refresh address to another. The refresh control circuit 40 may control a timing of the refresh operation, and may generate and provide the refresh address. The refresh control circuit 40 may be controlled to change details of the refreshing address RXADD (e.g., how the refresh address is calculated, the timing of the refresh addresses, the number of word lines represented by the address), or may operate based on internal logic.

The refresh control circuit 40 may selectively output a targeted refresh (e.g., RHR) address, which may specifies one or more victim address based on an aggressor row address, or an automatic refresh address (e.g., from a sequence of auto-refresh addresses) as the refresh address. Based on the type of refresh address, the row address control circuit 12 may perform a targeted refresh or auto-refresh operation. The automatic refresh addresses may be from a sequence of addresses which are provided based on activations of the refresh signal AREF. The refresh control circuit 40 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given word line. In other words, auto-refresh operations may be performed such that each word line is refreshed at a rate faster than the expected rate of information decay.

The refresh control circuit 40 may also determine targeted refresh addresses which are addresses that require refreshing (e.g., victim addresses corresponding to victim rows) based on the access pattern of nearby addresses (e.g., aggressor addresses corresponding to aggressor rows) in the memory cell array 11. The refresh control circuit 40 may use one or more signals of the device 10 to calculate the targeted refresh address. For example, the refresh address may be a calculated based on the row addresses XADD provided by the address decoder 32.

In some embodiments, the refresh control circuit 40 may sample the current value of the row address XADD provided by the address decoder 32, and determine a targeted refresh address based on one or more of the sampled addresses. The sampled addresses may be stored in an address storing circuit of the refresh control circuit 40. When a row address XADD is sampled, it may be compared to the stored addresses in the address storing circuit. In some embodiments, an aggressor address may be determined based on the sampled and/or stored addresses. For example, the comparison between the sampled address and the stored addresses may be used to update a count value (e.g., an access count) in a counter circuit associated with the stored addresses. The aggressor address may be calculated based on the count values stored in the counter circuits. The refresh addresses may then be generated based on the aggressor addresses.

While in general the present disclosure refers to determining aggressor and victim word lines and addresses, it should be understood that as used herein, an aggressor word line does not necessarily need to cause data degradation in neighboring word lines, and a victim word line does not necessarily need to be subject to such degradation. The refresh control circuit 40 may use some criteria to judge whether an address is an aggressor address, which may capture potential aggressor addresses rather than definitively determining which addresses are causing data degradation in nearby victims. For example, the refresh control circuit 40 may determine potential aggressor addresses based on a pattern of accesses to the addresses and this criteria may include some addresses which are not aggressors, and miss some addresses which are. Similarly, victim addresses may be determined based on which word lines are expected to be affected by aggressors, rather than a definitive determination of which word lines are undergoing an increased rate of data decay.

The refresh address may be provided with a timing based on a timing of the refresh signal AREF. During the periodic refresh operations of a refresh mode, the refresh control circuit 40 may have time slots corresponding to the timing of AREF, and may provide one or more refresh addresses during each time slot. In some embodiments, the targeted refresh/RHR address may be issued in (e.g., "steal") a time slot which would otherwise have been assigned to an auto-refresh address. In some embodiments, certain time slots may be reserved for targeted refresh addresses, and the refresh control circuit 40 may determine whether to provide a targeted refresh address, not provide an address during that time slot, or provide an auto-refresh address instead during the time slot.

In some embodiments, some or all of the calculations and/or other operations for determining the aggressor address for generating the refresh addresses may be performed each time a row address is sampled by the refresh control circuit 40. In some embodiments some or all of the calculations and/or other operation for determining the aggressor address may be performed each time a targeted/RHR address is to be issued for a RHR operation. In some embodiments, determining the aggressor address may be performed responsive, at least in part, to one or more signals, such as the ACT/PRE and/or AREF signals provided by the command control circuit 33. In some embodiments, determining a counter circuit having a highest count value may be initiated, at least in part, by a precharge signal PRE preceding a RHR operation.

Figure 2:
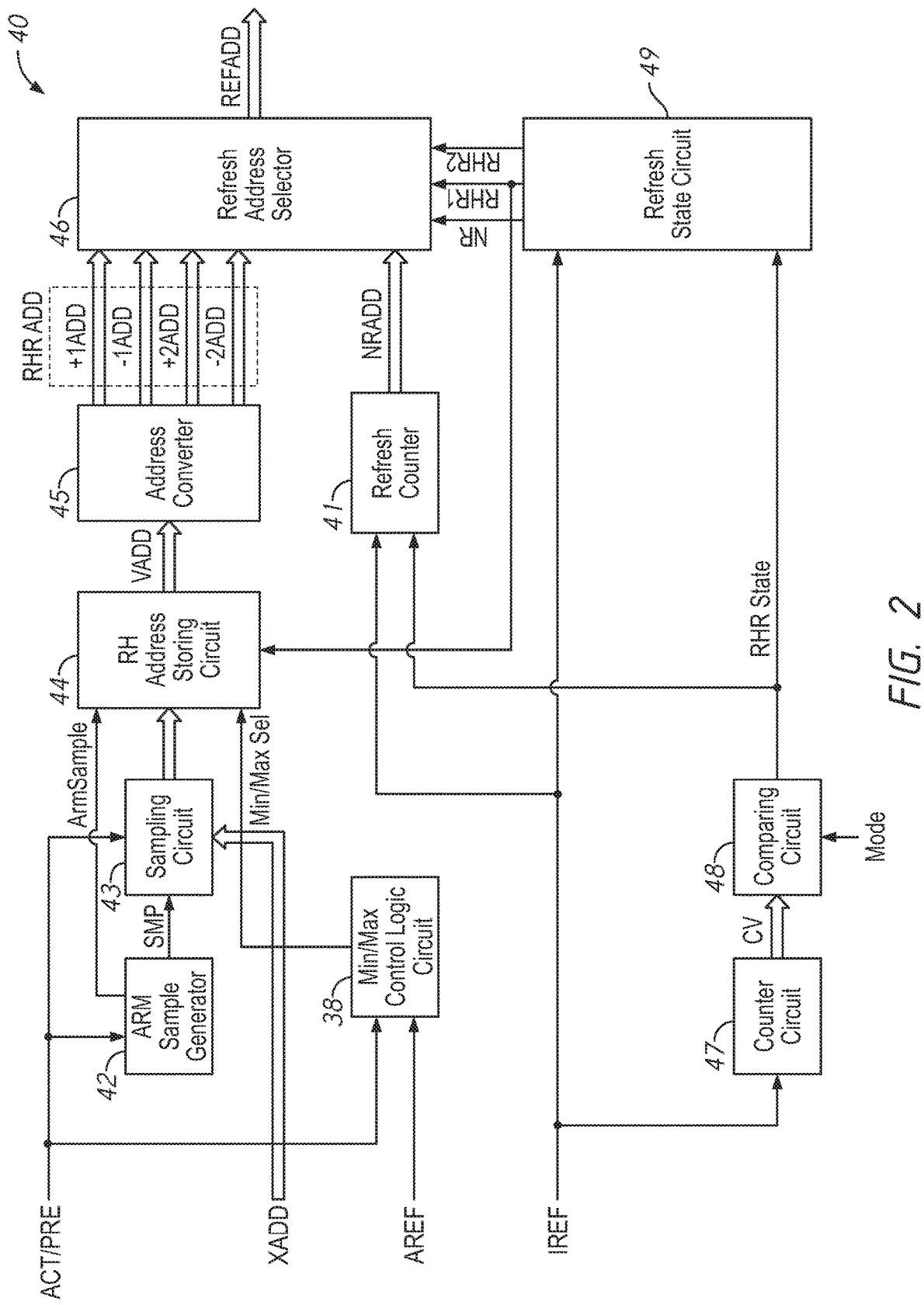
FIG. 2 is a block diagram of a refresh control circuit according to an embodiment of the present disclosure.

FIG. 2 is a block diagram of the refresh control circuit 40 according to an embodiment of the present disclosure.

As shown in FIG. 2, the refresh control circuit 40 includes a refresh counter 41, an ARM sample generator 42, a sampling circuit 43, a row hammer (RH) address storing circuit 44, an address convertor 45, and a refresh address selector 46. The refresh counter 41 generates a counter refresh address NRADD. The counter refresh address NRADD is incremented or decremented in response to an internal refresh signal IREF. The internal refresh signal IREF can be a signal activated multiple times on the basis of the refresh signal AREF.

The sampling circuit 43 samples the row address XADD at a timing when a sampling signal SMP generated by the ARM sample generator 42 is activated, and supplies the sampled row address XADD to the row hammer address storing circuit 44. The ARM sample generator 42 may activate the sampling signal SMP at a timing when the activation signal ACT is activated for a predetermined number of times. In some embodiments, the ARM sample generator 42 may further generate an operation timing control signal ArmSample, which may also be referred to as a sampling signal. The ArmSample signal may control when one or more operations are performed by the row hammer address storing circuit 44. In some embodiments, the ArmSample signal may be a pulse signal. In some embodiments, the ArmSample signal may be activated multiple times during an activation period (e.g., a period during which the activation signal ACT is active or a period between an activation command and a precharge command). For example, multiple pulses of the ArmSample signal may be provided to the row hammer address storing circuit 44 during the activation period. In some embodiments, the active ArmSample signal may be provided when the activation signal is active and the sampling signal SMP is also activated.

The row hammer address storing circuit 44 stores multiple row addresses. One or more of the row addresses stored in the row hammer address storing circuit 44 are supplied to the address convertor 45 via an address bus as the row address VADD. The address VADD provided from the row hammer address storing circuit 44 may correspond to a word line WL at which accesses are concentrated, for example, a row address associated with a highest count value of the multiple of row addresses stored in the row hammer address storing circuit 44. As will be described in more detail with reference to FIGS. 4 and 5, in some embodiments, the row hammer address storing circuit 44 may include a count comparing circuit that compares the count values to determine which row address is associated with the highest count value. In some embodiments, the count comparing circuit may also compare the count values to determine which row address is associated with the lowest count value. Whether the count comparing circuit determines the highest or lowest count value may be based, at least in part, on a state of a minimum/maximum calculation selection signal Min/Max Sel. For example, in some embodiments, when Min/Max Sel is high (e.g., a high logic state, '1'), the row hammer address storing circuit 44 may determine the row address associated with the highest count value and when Min/Max Sel is low (e.g., a low logic state, '0'), the row hammer address storing circuit 44 may determine the row address associated with the lowest count value.

The Min/Max Sel signal may be provided by a min/max control logic circuit 38. The min/max control logic circuit 38 may receive the activation/precharge ACT/PRE signal and the refresh signal AREF. As will be described in more detail with reference to FIG. 5, the state of the Min/Max Sel signal may be based, at least in part, on the ACT/PRE and/or AREF signals. For example, in some embodiments, the Min/Max Sel signal may be in a 'default' state (e.g., high) that indicates a highest count value should be determined. Continuing this example, the Min/Max Sel signal may transition to a different state (e.g., low) that indicates a lowest count value should be determined when the ACT/PRE signal is active and the AREF signal is inactive.

Figure 3:
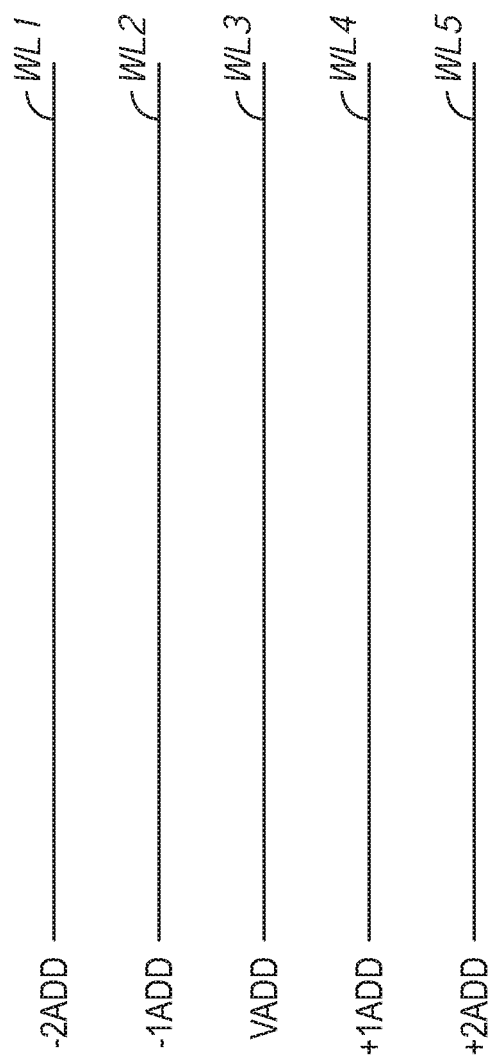
FIG. 3 is an illustration of an arrangement of word lines of a memory cell array.

The address convertor 45 converts the row addresses VADD to generate row hammer refresh addresses (collectively referred to as RHR ADD). The RHR ADD may include, for example, +1ADD, −1ADD, +2ADD, and −2ADD. The row hammer refresh addresses +1ADD and −1ADD are addresses of word lines WL adjacent (e.g., on both sides) to the word line WL having the row address VADD assigned thereto. The row hammer refresh addresses +2ADD and −2ADD are addresses of word lines WL two lines away from the word line WL having the row address VADD assigned thereto. For example, when word lines WL1 to WL5 are arranged in the order as shown in FIG. 3 and accesses are concentrated at the word line WL3 (e.g., WL3 is an aggressor row), the row address VADD corresponds to the word line WL3, the row hammer refresh addresses −1ADD and +1ADD correspond to the word lines WL2 and WL4, respectively, and the row hammer refresh addresses −2ADD and +2ADD correspond to the word lines WL1 and WL5, respectively. In the word lines WL4, WL2, WL5, and WL1 to which the row hammer refresh addresses +1ADD, −1ADD, +2ADD, and −2ADD are respectively assigned, the information storing performance of memory cells MC associated with word lines adjacent or two lines away from the word line WL3 may decrease because accesses are concentrated at the word line WL3. The counter refresh address NRADD and the row hammer refresh addresses +1ADD, −1ADD, +2ADD, and −2ADD are supplied to the refresh address selector 46 via one or more address busses.

The refresh control circuit 40 further includes a counter circuit 47, a comparing circuit 48, and a refresh state circuit 49. The counter circuit 47 increments or decrements a count value CV in response to the internal refresh signal IREF. The comparing circuit 48 receives the count value CV and activates a refresh state signal RHR State each time the count value CV reaches a predetermined value. The predetermined value can be changed with a mode signal MODE. Therefore, it suffices to set the predetermined value to a small value with the mode signal MODE when the frequency of the targeted refresh/RHR operations is to be increased, and set the predetermined value to a large value with the mode signal MODE when the frequency of the row hammer refresh operations is to be decreased. The refresh counter 41 may temporarily stop an update operation of the counter refresh address NRADD when the refresh state signal RHR State is activated.

The refresh state signal RHR State is supplied to the refresh state circuit 49. The refresh state circuit 49 generates refresh selection signals NR, RHR1, and RHR2 on the basis of the internal refresh signal IREF and the refresh state signal RHR State.

The refresh state circuit 49 activates the refresh selection signal NR when the refresh state signal RHR State is in an inactive state. The refresh selection signal NR is a signal activated when a refresh operation is to be performed for the counter refresh address NRADD. In a case where the refresh selection signal NR is activated, the refresh address selector 46 selects the counter refresh address NRADD output from the refresh counter 41 and outputs the counter refresh address NRADD as a refresh address REFADD. When the refresh state signal RHR State is in an active state, the refresh state circuit 49 activates the refresh selection signal RHR1 or RHR2. The refresh selection signal RHR1 is a signal activated when the row hammer refresh operation is to be performed on the word lines adjacent the word line at which accesses are concentrated (e.g., performed on word lines WL2 and WL4 for concentrated accesses to word line WL3). In a case where the refresh selection signal RHR1 is activated, the refresh address selector 46 selects the row hammer refresh addresses +1 ADD and −1ADD output from the address convertor 45 and outputs the row hammer refresh addresses +1ADD and −1ADD as the refresh addresses REFADD. The refresh selection signal RHR1 is supplied also to the row hammer address storing circuit 44. The refresh selection signal RHR2 is a signal activated when the row hammer refresh operation is to be performed on the word lines two word lines away from the word line at which accesses are concentrated (e.g., performed on word lines WL1 and WL5 for concentrated accesses to word line WL3). In a case where the refresh selection signal RHR2 is activated, the refresh address selector 46 selects the row hammer refresh addresses +2ADD and −2ADD output from the address convertor 45 and outputs the row hammer refresh addresses +2ADD and −2ADD as the refresh addresses REFADD.

Although shown as part of the refresh control circuit 40, in some embodiments, the min/max control logic circuit 38, the counter circuit 47, and/or comparing circuit 48 may be included in another component of the device 10, for example, command control circuit 33.

Figure 4:
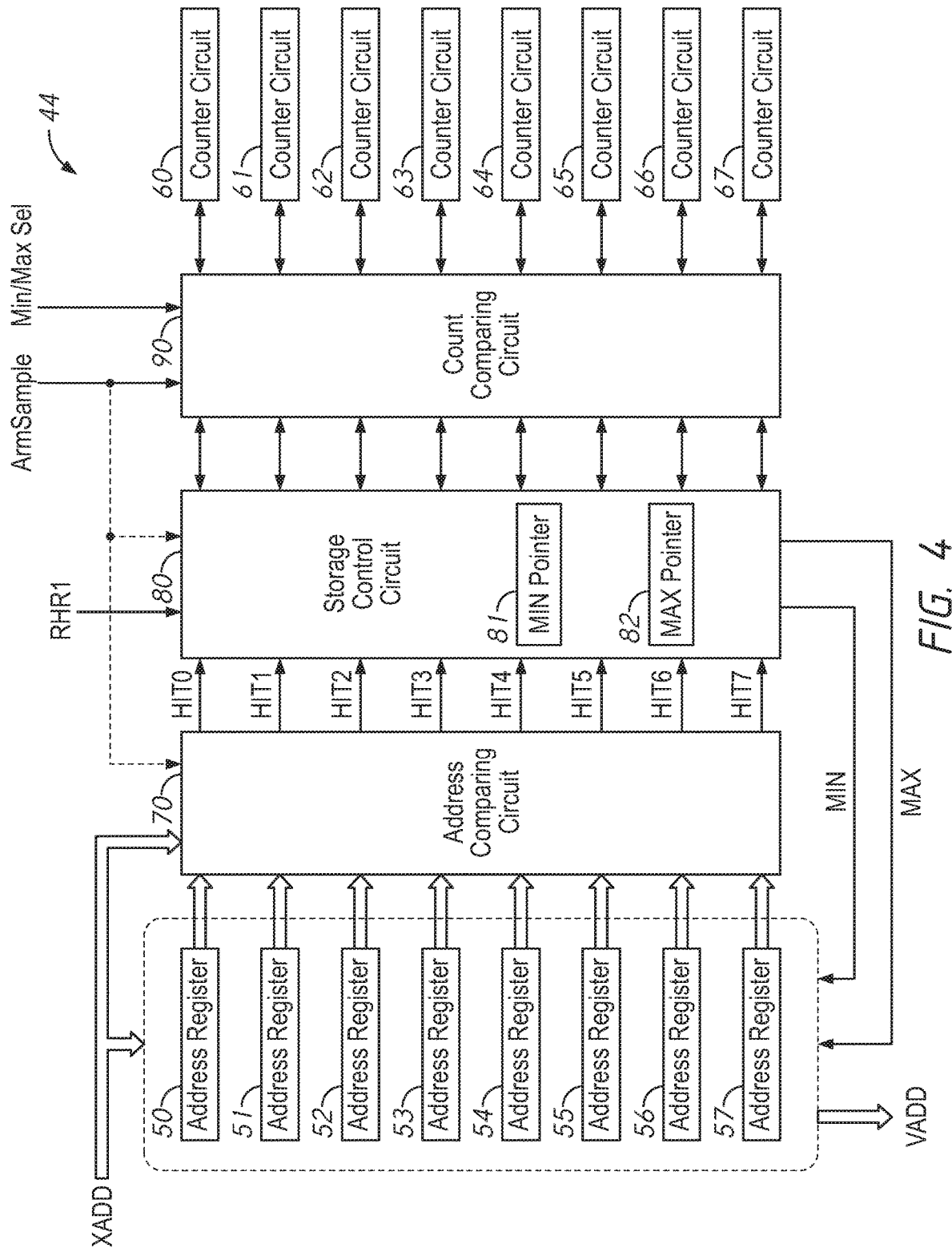
FIG. 4 is a block diagram of a row hammer address storing circuit according to an embodiment of the present disclosure.

FIG. 4 is a block diagram of the row hammer address storing circuit 44 according to an embodiment of the present disclosure.

As shown in FIG. 4, the row hammer address storing circuit 44 includes multiple address registers 50 to 57, multiple counter circuits 60 to 67, an address comparing circuit 70, a storage control circuit 80, and a count comparing circuit 90. While eight address registers 50 to 57 are illustrated in an example shown in FIG. 4, the number of address registers included in the row hammer address storing circuit 44 is not limited thereto. The row addresses XADD sampled by the sampling circuit 43 are stored in the address registers 50 to 57, respectively. The counter circuits 60 to 67 correspond to the address registers 50 to 57, respectively.

The address comparing circuit 70 compares the input row address XADD with each of the row addresses XADD stored in the address registers 50 to 57. When the input row address XADD matches with any of the row addresses XADD stored in the address registers 50 to 57, the address comparing circuit 70 activates a corresponding one of hit signals HIT0 to HIT7. When any of the hit signals HIT0 to HIT7 is activated, the storage control circuit 80 increments the count value of a corresponding one of the counter circuits 60 to 67. Therefore, the count values of the counter circuits 60 to 67 indicate the numbers of times when the row addresses XADD stored in the address registers 50 to 57 are sampled by the sampling circuit 43, respectively.

The count comparing circuit 90 compares the count values stored in the counter circuits 60 to 67 and determines which of the counter circuits 60 to 67 includes a highest count value and/or determines which of the counter circuits 60 to 67 includes a lowest count value. In some embodiments, the comparing circuit 90 may include one or more comparator circuits (not shown) which may perform one or more operations to compare the count values stored in two or more of the counter circuits 60 to 67 to determine which of the counter circuits 60 to 67 includes the highest and/or lowest count value. Which of the counter circuits 60 to 67 includes the highest and/or lowest count value may be provided to the storage control circuit 80. The storage control circuit 80 includes a minimum pointer 81 that indicates one of the counter circuits 60 to 67 having the lowest count value determined by the count comparing circuit 90, and a maximum pointer 82 that indicates one of the counter circuits 60 to 67 having the highest count value determined by the count comparing circuit 90.

The count comparing circuit 90 may receive minimum/maximum calculation selection signal Min/Max Sel and operation timing control/sampling signal ArmSample. The Min/Max Sel signal may be provided by min/max control logic circuit 38 and the ArmSample signal may be provided by Arm sample generator 42 in some embodiments. The Min/Max Sel signal may determine whether the count comparing circuit 90 determines which of the counter circuits 60 to 67 includes the highest count value or which of the counter circuits 60 to 67 includes the lowest count value. The ArmSample signal may determine, at least in part, when the count comparing circuit 90 makes the lowest count value determination (e.g., determines when the count comparing circuit 90 initiates one or more operations to make the determination). In some embodiments, the count comparing circuit 90 may determine which counter circuit 60 to 67 includes the lowest count value responsive to an active ArmSample signal. In some embodiments, the count comparing circuit 90 may determine which counter circuit 60 to 67 includes the lowest count value responsive, at least in part, to the Min/Max Sel signal transitioning from a state indicating the highest count value should be determined (e.g., a high state) to a state indicating the lowest count value should be determined (e.g., a low state). In some embodiments, the count comparing circuit 90 may determine which counter circuit 60 to 67 includes the highest count value responsive, at least in part, to the Min/Max Sel signal transitioning from a state indicating the lowest count value should be determined (e.g., a low state) to a state indicating the highest count value should be determined (e.g., a high state). In other words, either or both of the ArmSample signal and the Min/Max Sel signal may cause the count comparing circuit 90 to initiate one or more operations to determine the counter circuit associated with the highest and/or lowest count value.

Returning to the address comparing circuit 70, when none of the hit signals HIT0 to HIT7 is activated, that is, when the input row address XADD does not match with any of the row addresses XADD respectively stored in the address registers 50 to 57, the storage control circuit 80 resets one of the counter circuits 60 to 67 indicated by the minimum pointer 81 to an initial value and supplies a point number MIN to the address registers 50 to 57. Accordingly, the input row address XADD is overwritten in one of the address registers 50 to 57 indicated by the point value MIN. In this way, when the input row address XADD does not match with any of the row addresses XADD respectively stored in the address registers 50 to 57, the value of one of the address registers 50 to 57 storing the row address XADD that is least frequently accessed is overwritten.

One of the row addresses XADD stored in the address registers 50 to 57 is output as the row address VADD in response to the refresh selection signal RHR1. When the refresh selection signal RHR1 is activated, a point value MAX indicated by the maximum pointer 82 is selected. One of the address registers 50 to 57 is selected by the point value MAX and the row address XADD stored in the selected one of the address registers 50 to 57 is output as the row address VADD. The value of one of the counter circuits 60 to 67 corresponding to the point value MAX is reset to an initial value.

In some embodiments, in addition to controlling the timing of operations performed by the count comparing circuit 90, the ArmSample signal may control timing of operations performed by the address comparing circuit 70 and/or storage control circuit 80. In some embodiments, the address comparing circuit 70 may compare the input row address XADD and provide a hit signal (if a match) responsive, at least in part, to activation of the ArmSample signal. In some embodiments, the storage control circuit 80 may increment and/or reset a counter circuit 60 to 67 responsive, at least in part, to an activation of the ArmSample. In some embodiments, the timing of the operations of the address comparing circuit 70 and/or storage control circuit 80 may be further controlled by additional signals not shown.

Figure 5:
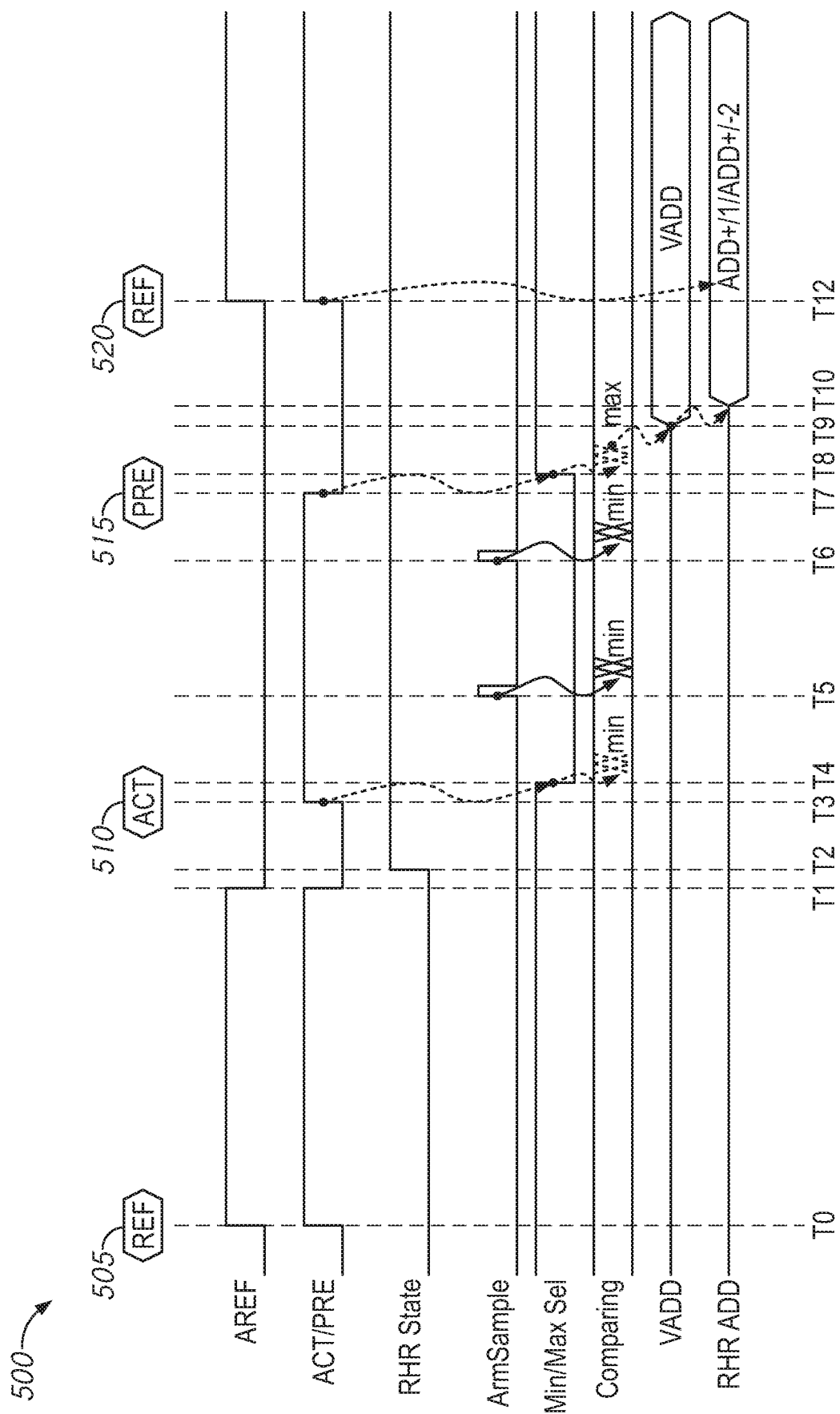
FIG. 5 is a timing diagram of various signals of a semiconductor device during memory operations according to an embodiment of the present disclosure.

FIG. 5 is a timing diagram of various signals of a semiconductor device during memory operations according to an embodiment of the present disclosure. The states of signals within device 10 during various operations may be reflected in timing diagram 500, and the signals of timing diagram 500 will be described with reference to FIGS. 1, 2, and 4. However, timing diagram 500 may reflect the operation of other memory devices other than the specific device 10 shown in FIGS. 1-4.

The first line of timing diagram 500 illustrates the state of a refresh signal AREF. In some embodiments, the AREF signal may be provided by a command control circuit, such as command control circuit 33. The second line of timing diagram 500 indicates a state of an activation/precharge signal ACT/PRE. The ACT/PRE signal may be provided by the command control circuit in some embodiments. The third line of timing diagram 500 illustrates the state of a refresh state signal RHR State. In some embodiments, the RHR State signal may be provided by a comparing circuit, such as comparing circuit 48. The fourth line of timing diagram 500 illustrates a state of an operation timing control/sampling signal ArmSample. In some embodiments, the ArmSample signal may be provided by an arm sample generator, such as arm sample generator 42.

The fifth line of timing diagram 500 illustrates a state of a minimum/maximum calculation selection signal Min/Max Sel. In some embodiments, the Min/Max Sel signal may be provided by a min/max control logic circuit, such as min/max control logic circuit 38. In some embodiments, the Min/Max Sel signal may have a default and/or resting state. By default state, it is meant a state at which the Min/Max Sel signal is provided unless the ACT/PRE is active and the AREF signal is inactive. The default state may be a state that indicates that a counter circuit (e.g., counter circuits 60-67) with a highest count value should be determined by a count comparing circuit (e.g., count comparing circuit 90). In the example shown in FIG. 5, the default state is a high logic state.

The sixth line of timing diagram 500 indicates a timing of operations of a count comparing circuit, such as count comparing circuit 90. Operations may include, but are not limited to, comparing count values from two or more counter circuits. The operations may be initiated at or around a left edge of a first "X" and a result of the operations may be available at or around an a right edge of a final "X." The seventh line of timing diagram 500 indicates a state of an address bus providing a row address VADD. The address bus may provide the row address VADD from a row hammer address storing circuit, such as address storing circuit 44, to an address convertor, such as address convertor 45 in some embodiments. The final line of timing diagram 500 indicates a state of an address bus providing one or more row hammer refresh addresses RHR ADD. The RHR address RHR ADD may be provided from the address convertor to a refresh address selector, such as refresh address selector 46 in some embodiments.

A refresh command 505 may be received by a device, such as device 10. Responsive, at least in part, to the refresh command 505, the AREF signal may transition to an active state (a high state in the example shown in FIG. 5) to indicate a refresh operation, and the ACT/PRE signal may also transition to an active state (a high state in the example shown in FIG. 5) at or around a time T0. The refresh operation to be performed responsive to the refresh command 505 may be an auto-refresh operation. Thus, the RHR State signal may remain in an inactive (a low state in the example shown in FIG. 5) during the refresh operation. After a conclusion of the refresh operation, the AREF and ACT/PRE signals may transition to inactive states (low states in the example shown in FIG. 5) at or around time T1.

The next refresh operation may be determined to be a targeted refresh/RHR operation. Accordingly, the RHR State signal may transition to an active state at or around time T2. An activation command 510 may be received by the device. Responsive to the activation command 510, the ACT/PRE signal may transition to the active state at or around time T3. Responsive to the active ACT/PRE signal and inactive AREF signal, the Min/Max Sel signal may transition from a default state (e.g., high state) that indicates the counter circuit with a highest count value should be determined to another state (e.g., low) that indicates the counter circuit with a lowest count value should be determined at or around time T4.

Responsive to the transition of the Min/Max Sel signal, the count comparing circuit may perform one or more operations to determine a counter circuit including the lowest count value beginning at or around time T4 as indicated by the "X's" in the Comparing line. The result of the count comparing circuit's operations may be used to update a pointer in a control circuit, such as MIN pointer 81 in storage control circuit 80.

At or around time T5, the sampling signal ArmSample may provide an active pulse (a high pulse in the example shown in FIG. 5). Although not shown in FIG. 5, the ArmSample pulse may be associated with and/or trigger an address comparing circuit, such as address comparing circuit 70, to perform operations to determine whether a sampled row address matches an address stored in an address register (e.g., address registers 50-57). If the sampled row address matches a row address stored in an address register, a count value in a corresponding counter circuit is incremented. If the sampled row address does not match a row address stored in the address register, the sampled row address is written to the address register associated with the lowest count value as determined by the count comparing circuit at or around time T4. The count value associated with corresponding counter circuit is also reset.

Responsive to the active pulse of the ArmSample at or around T5 and the continued low state of the Min/Max Sel signal, the count comparing circuit may again perform operations to determine a counter circuit including the lowest count value as indicated by the "X's" in the Comparing line. The result of the count comparing circuit's operations may be used to update a pointer in a control circuit, such as MIN pointer 81 in storage control circuit 80. If the sampled row address matched an address stored in an address register and a corresponding counter circuit was incremented, a different address register may be associated with the lowest count value. If the sampled row address was written to an address register, the same address register may be associated with a lowest count value because the corresponding counter circuit was reset.

At or around time T6, the ArmSample signal may provide a second active pulse. Again, the ArmSample pulse may be associated with and/or trigger an address comparing circuit, such as address comparing circuit 70, to perform operations to determine whether a sampled row address matches an address stored in an address register. Because the second ArmSample signal occurs during execution of a same activation command 510 as the first pulse, the sampled row address will be the same as the sampled row address previously compared. Accordingly, the sampled row address will match a row address in an address register and a corresponding count value will be incremented.

Responsive to the active pulse of the ArmSample at or around T6 and the continued low state of the Min/Max Sel signal, the count comparing circuit may again perform operations to determine a counter circuit including the lowest count value as indicated by the "X's" in the Comparing line. The result of the count comparing circuit's operations may be used to update a pointer in a control circuit, such as MIN pointer 81 in storage control circuit 80. The counter circuit including the lowest count value may or may not have changed between the two determinations of the lowest count value performed by the count comparing circuit.

A precharge command 515 may be received by the device. Responsive to the precharge command, the ACT/PRE signal may transition to an inactive state at or around time T7. Responsive, at least in part, to the ACT/PRE signal transitioning to the inactive state, the Min/Max Sel signal may transition from the low state to the default state at or around time T8. As previously discussed, with the Min/Max Sel signal in the default state the count comparing circuit determines a counter circuit with a highest count value.

Responsive to the transition in the Min/Max Sel signal, the count comparing circuit may perform one or more operations to determine a counter circuit including the highest count value beginning at or around time T8 as indicated by the "X's" in the Comparing line. The result of the count comparing circuit's operations may be used to update a pointer in a control circuit, such as MAX pointer 82 in storage control circuit 80. The updated pointer may be used to provide a row address VADD on an address bus at or around time T9. The address VADD may be a row address associated with the highest count value. The address VADD may be used by an address convertor to generate RHR addresses RHR ADD. The RHR addresses may be provided on an address bus at or around time T10.

A refresh command 520 may be received by the device. Responsive to the refresh command 520, the refresh signal AREF and the ACT/PRE signals may transition to active states, and the RHR addresses RHR ADD remain available on the address bus. Because RHR State is active, a RHR operation may be performed. Thus, the RHR addresses RHR ADD may be used as refresh addresses during the refresh operation performed responsive to the refresh command 520.

By triggering the RHR address calculation operations earlier, the RHR addresses RHR ADD may be available sooner than if the calculation operation for the RHR address was performed responsive to receipt of the refresh command 520. This may reduce the risk that the RHR addresses RHR ADD are not available to be used as refresh addresses during a RHR operation. This may reduce the need to delay the RHR operation and/or store the RHR addresses RHR for a subsequent RHR operation. In some embodiments of the disclosure, the RHR address calculation operation is triggered by causing the count comparing circuit to determine a counter circuit including the highest count value based on the precharge command 515. For example, the Min/Max Sel signal may transition from the low state to the high state at the receipt of the precharge command 515, and the count comparing circuit may determine a counter circuit including the highest count value responsive to the transition of the Min/Max Sel signal.

Figure 6:
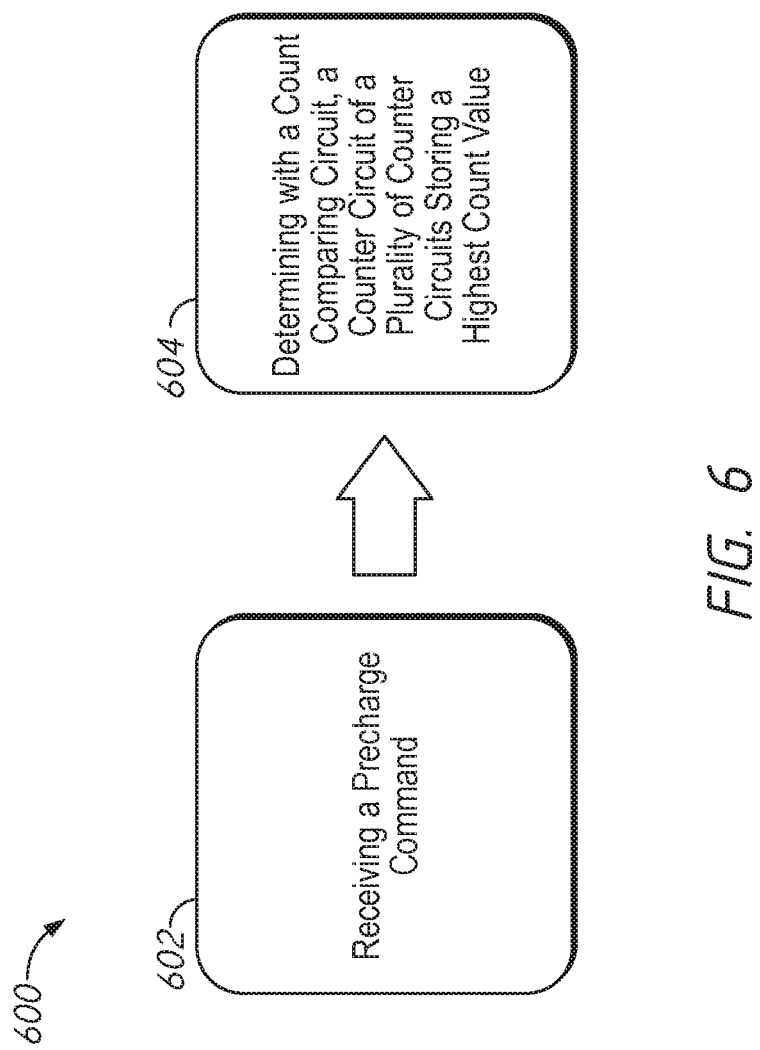
FIG. 6 is a flow chart of a method according to an embodiment of the present disclosure.

FIG. 6 is a flow chart of a method according to an embodiment of the present disclosure. In some embodiments, the method 600 may be performed by device 10.

At block 602, "receiving a precharge command" may be performed. In some embodiments, an inactive activation signal may be provided responsive, at least in part, to the precharge command. In some embodiments, the signal may be provided to a min/max control logic circuit, such as min/max control logic circuit 38.

Responsive, at least in part, to the precharge command, at block 604, "determining with a count comparing circuit, a counter circuit of a plurality of counter circuits storing a highest count value" may be performed. In some embodiments, the determining may be performed by count comparing circuit 90. In some embodiments, the counter circuits may include counter circuits 60-67.

In some embodiments, the method 600 may further include providing a row address from an address register associated with the counter circuit of the plurality of counter circuits storing the highest count value. In some embodiments, the address registers may include row address registers 50-57. In some embodiments, method 600 may further include generating at least one refresh address based, at least in part, on the row address. In some embodiments, the refresh address may be generated by an address convertor, such as address convertor 45. In some embodiments, method 600 may further include refreshing at least one word line corresponding to the at least one refresh address. In some embodiments, the refreshing may be responsive, at least in part, to a refresh command and the active refresh state signal. In some embodiments, the active refresh state signal may cause a targeted refresh/RHR operation to be performed responsive to the refresh command.

In some embodiments, method 600 may further include receiving an active activation signal at the min/max control logic circuit. In some embodiments, the active activation signal is provided responsive, at least in part, to an activation command. Responsive, at least in part, to the inactive refresh signal and the active activation signal, method 600 may further include transitioning the selection signal from one state to another state by the min/max control logic circuit. In some embodiments, responsive, at least in part, to the transitioning of the selection signal from the one state to the other state, method 600 may further include determining with the count comparing circuit, a counter circuit of the plurality of counter circuits storing a lowest count value.

In some embodiments, method 600 may further include receiving an active timing control signal. In some embodiments, the timing control signal may be a sampling signal provided by an arm sample generator, such as arm sample generator 42. In some embodiments, responsive, at least in part, to the active timing control signal, method 600 may further include determining with the count comparing circuit, the counter circuit of the plurality of counter circuits storing the lowest count value. In some embodiments, responsive, at least in part, to the active timing control signal, method 600 may further include comparing, with an address comparing circuit, such as address comparing circuit 70, a sampled row address to a plurality of row addresses stored in a corresponding one of a plurality of address registers, such as address registers 50-57. In some embodiments, method 600 may include storing in an address register of the plurality of address registers associated with the counter circuit of the plurality of counter circuits storing the lowest count value when the sampled row address does not match the plurality of row addresses. When the sampled row address matches a row address of the plurality of row addresses, method 600 may include incrementing a counter circuit of the plurality of counter circuits associated with an address register of the plurality of address registers storing the row address of the plurality of row addresses. In some embodiments, the active timing control signal may be provided a plurality of times during a time period between the activation command and the precharge command and the count comparing circuit determines the counter circuit of the plurality of counter circuits storing the lowest count value each time the active timing control signal is provided.

Figure 7:
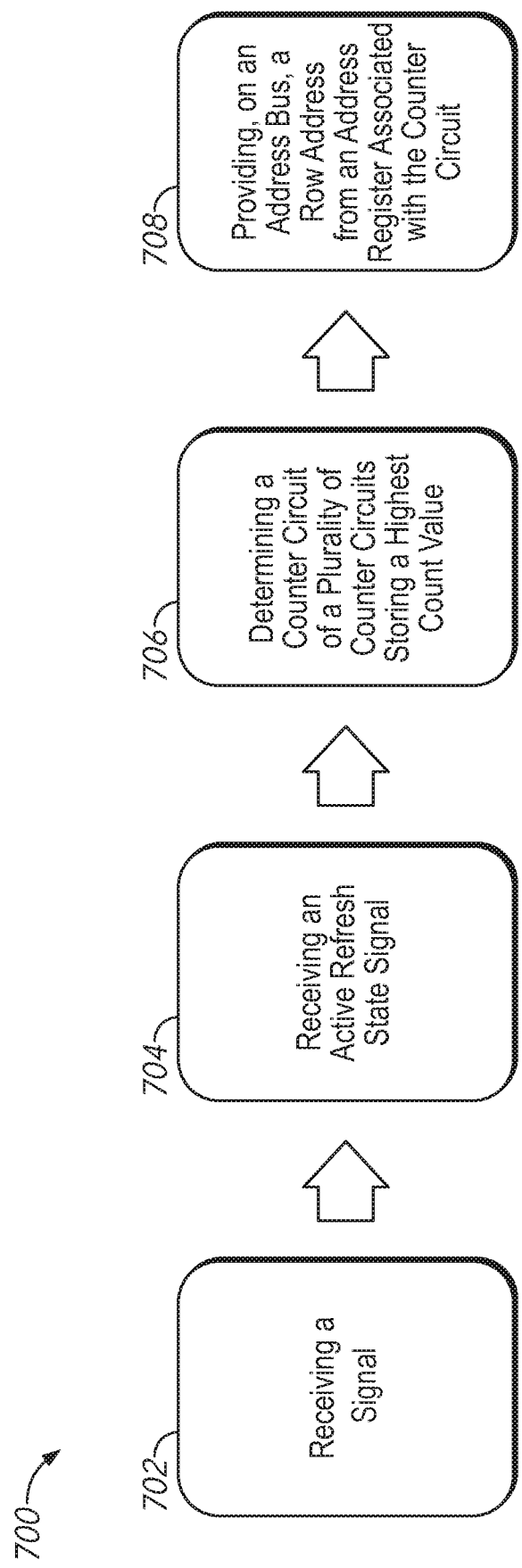
FIG. 7 is a flow chart of a method according to an embodiment of the present disclosure.

FIG. 7 is a flow chart of a method according to an embodiment of the present disclosure. In some embodiments, the method 700 may be performed by device 10.

At block 702, "receiving a signal" may be performed. The signal may be received by a device, such as device 10. In some embodiments, the signal may be received by a command control circuit, such as command control circuit 33. In some embodiments, the signal may be a command, such as a precharge command. At block 704, "receiving an active refresh state signal" may be performed. In some embodiments, the refresh state signal may be provided by the command control circuit. In some embodiments, the refresh state signal may be provided by a component of a refresh control circuit. In some embodiments, the active refresh state signal may be associated with a row hammer refresh operation. In some embodiments, the refresh state signal may be received by a min/max control logic circuit, such as min/max control logic circuit 38.

Responsive, at least in part, to the signal, at block 706 "determining a counter circuit of a plurality of counter circuits storing a highest count value" may be performed. In some embodiments, the determining may be performed by a row hammer address storing circuit, such as row hammer address storing circuit 44. More specifically, in some embodiments, the determining may be performed by a count comparing circuit, such as count comparing circuit 90. In some embodiments, the determining may be performed responsive to a transition of a selection signal provided by the min/max control logic circuit. In some embodiments, the transition of the selection signal is made responsive to the signal, which as noted, may be a precharge command in some embodiments. In some embodiments, the counter circuits may include counter circuits 60-67. At block 708, "providing, on an address bus, a row address from an address register associated with the counter circuit" may be performed. In some embodiments, the address register may include one of address registers 50-57. In some embodiments, the address bus may be the address bus labeled VADD in FIG. 2 and FIG. 4.

In some embodiments, method 700 may further include generating a refresh address based on the row address. In some embodiments, the generating may be performed by an address convertor, such as address convertor 45. Method 700 may further include providing the refresh address on a second address bus. In some embodiments, the second address bus may include one or more address busses labeled RHR ADD.

In some embodiments, method 700 may further include receiving a refresh command. In some embodiments, the refresh command may be received by the command control circuit. Responsive, at least in part, to the refresh command, in some embodiments, method 700 may include refreshing a word line corresponding to the refresh address. In some embodiments, the word line may be refreshed, at least in part, by a row address control circuit, such as row address control circuit 12.

The apparatuses, methods, and systems disclosed herein may permit determination of a counter of an address storing circuit with a highest count value may be initiated by a signal received preceding a RHR operation. In some examples, the signal may be a command, such as a precharge command. This may permit additional time prior to the RHR operation for the determination of the counter with the highest count value, providing an address associated with the counter, and generating one or more refresh addresses from the address. The additional time may reduce or eliminate the risk that refresh addresses will not be available for the RHR operation.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying modes of the disclosed invention. Thus, it is intended that the scope of at least some of the present invention herein disclosed should not be limited by the particular disclosed embodiments described above.

What is claimed is:

1. An apparatus comprising:
a plurality of address registers each configured to store a row address;
a plurality of counter circuits each configured to store a count value corresponding to an associated one of the plurality of address registers;
a comparing circuit configured to determine a counter circuit of the plurality of counter circuits storing a highest count value; and
a control logic circuit configured to control the comparing circuit to determine the counter circuit of the plurality of counter circuits storing the highest count value responsive to a precharge command received by the apparatus.

2. The apparatus of claim 1, wherein the control logic circuit is configured to provide a selection signal to the comparing circuit, wherein the comparing circuit is configured to determine the counter circuit of the plurality of counter circuits storing the highest count value responsive to the selection signal transitioning from a first state to a second state, wherein the control logic circuit is configured to transition the selection signal from the first state to the second state based, at least in part, on the precharge command.

3. The apparatus of claim 2, wherein the comparing circuit is further configured to determine a counter circuit of the plurality of counter circuits storing a lowest count value responsive to the selection signal transitioning from the second state to the first state, wherein the control logic circuit is configured to transition the selection signal from the second state to the first state based, at least in part, on an activation command received by the apparatus.

4. The apparatus of claim 3, further comprising a sample generator circuit configured to provide a sampling signal to the comparing circuit, wherein the comparing circuit is further configured to determine the counter circuit of the plurality of counter circuits storing the lowest count value responsive to activation of the timing control signal.

5. The apparatus of claim 1, further comprising a storage control circuit coupled to the comparing circuit, the storage control circuit comprising a pointer, wherein the pointer stores a value indicating an address register of the plurality of address registers associated with the counter circuit storing the highest count value determined by the comparing circuit.

6. The apparatus of claim 5, further comprising an address convertor, wherein the storage control circuit is configured to cause a row address stored in the address register of the plurality of address registers associated with the counter circuit storing the highest count value to be provided to the address convertor, wherein the address convertor is configured to generate one or more refresh addresses based, at least in part, on the row address.

7. The apparatus of claim 2, wherein the control logic circuit is configured to receive an activation signal and a refresh signal wherein the control logic circuit is configured to provide the selection signal in the first state when the activation signal is in an active state and the refresh signal is in an inactive state.

8. The apparatus of claim 7, further comprising a command control circuit configured to provide the activation signal and the refresh signal.

9. A method comprising:
receiving a precharge command at a memory; and
responsive, at least in part, to the precharge command, determining with a count comparing circuit, a counter circuit of a plurality of counter circuits storing a highest count value.

10. The method of claim 9, further comprising:
providing a row address from an address register associated with the counter circuit of the plurality of counter circuits storing the highest count value;
generating at least one refresh address based, at least in part, on the row address; and
responsive, at least in part, to a refresh command and the active refresh state signal, refreshing at least one word line corresponding to the at least one refresh address.

11. The method of claim 9, further comprising transitioning a selection signal from a first state to a second state responsive, at least in part, to the precharge command, wherein determining with the count comparing circuit, the counter circuit of the plurality of counter circuits storing a highest count value is performed responsive to the transitioning.

12. The method of claim 11, further comprising:
receiving an activation command;
responsive, at least in part, to the activation command, transitioning the selection signal from the first state to the second state; and
responsive, at least in part, to the transitioning of the selection signal from the first state to the second state, determining with the count comparing circuit, a counter circuit of the plurality of counter circuits storing a lowest count value.

13. The method of claim 12, further comprising:
receiving an active timing control signal; and
responsive, at least in part, to the active timing control signal, determining with the count comparing circuit, the counter circuit of the plurality of counter circuits storing the lowest count value.

14. The method of claim 13, further comprising, responsive, at least in part, to the active timing control signal:
comparing, with an address comparing circuit, a sampled row address to a plurality of row addresses stored in a corresponding one of a plurality of address registers;
storing in an address register of the plurality of address registers associated with the counter circuit of the plurality of counter circuits storing the lowest count value when the sampled row address does not match the plurality of row addresses; and
when the sampled row address matches a row address of the plurality of row addresses, incrementing a counter circuit of the plurality of counter circuits associated with an address register of the plurality of address registers storing the row address of the plurality of row addresses.

15. The method of claim 13, wherein the active timing control signal is provided a plurality of times during a time period between the activation command and the precharge command and the count comparing circuit determines the counter circuit of the plurality of counter circuits storing the lowest count value each time the active timing control signal is provided.

16. The method of claim 9, further comprising performing a row hammer refresh operation responsive to a refresh command and the active refresh state signal.

17. A method comprising:
receiving a signal;
receiving an active refresh state signal, wherein the active refresh state signal is associated with a row hammer refresh operation;
responsive, at least in part, to the signal determining a counter circuit of a plurality of counter circuits storing a highest count value, wherein the determining is performed by a count comparing circuit responsive to a transition of a selection signal provided by a control logic circuit, wherein the transition of the selection signal is made responsive to the signal, wherein the signal is a precharge command; and
providing, on an address bus, a row address from an address register associated with the counter circuit.

18. The method of claim 17, further comprising:
generating a refresh address based on the row address; and
providing the refresh address on a second address bus.

19. The method of claim 18, further comprising:
receiving a refresh command; and
responsive, at least in part, to the refresh command and the active refresh state signal, refreshing a word line corresponding to the refresh address.

* * * * *